United States Patent
Tucker et al.

(10) Patent No.: US 12,270,848 B2
(45) Date of Patent: Apr. 8, 2025

(54) FACILITATING SEPARATELY-SOURCED REDUNDANT POWER FEEDS TO A SYSTEM

(71) Applicant: INTERNATIONAL BUSINESS MACHINES CORPORATION, Armonk, NY (US)

(72) Inventors: Brian Charles Tucker, Clinton Corners, NY (US); Enver Candan, Fishkill, NY (US); Marc Henri Coq, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 179 days.

(21) Appl. No.: 18/319,694

(22) Filed: May 18, 2023

(65) Prior Publication Data

US 2024/0385233 A1    Nov. 21, 2024

(51) Int. Cl.
*G06F 1/28* (2006.01)
*G01R 29/18* (2006.01)
*G06F 1/26* (2006.01)

(52) U.S. Cl.
CPC ............ *G01R 29/18* (2013.01); *G06F 1/263* (2013.01); *G06F 1/28* (2013.01)

(58) Field of Classification Search
CPC ............ G01R 29/18; G06F 1/263; G06F 1/28
See application file for complete search history.

(56) References Cited

U.S. PATENT DOCUMENTS

| | | | |
|---|---|---|---|
| 4,199,798 A | 4/1980 | Leppke et al. | |
| 5,055,769 A | 10/1991 | Gentile | |
| 5,467,011 A | 11/1995 | Hunt | |
| 8,013,592 B2 | 9/2011 | Guibbini et al. | |
| 8,682,604 B2 * | 3/2014 | Fan ........................ | G01R 29/18 702/72 |

(Continued)

OTHER PUBLICATIONS

International Search Report for PCT/EP2024/060781 dated Jul. 1, 2024, 16 pages.

(Continued)

*Primary Examiner* — Aurel Prifti
(74) *Attorney, Agent, or Firm* — Michael A. Petrocelli, Esq.; Kevin P. Radigan, Esq.; Heslin Rothenberg Farley & Mesiti P.C.

(57) ABSTRACT

A signal-analysis-based process for detecting and correcting power feeds is provided. The process includes obtaining voltage waveform data for power feeds connected to a system, and determining for the power feeds, using the obtained voltage waveform data, at least one respective signal characteristic. Further, the process includes comparing the respective signal characteristics of the power feeds to ascertain at least one signal characteristic difference between the power feeds. Based on the at least one signal characteristic difference not exceeding at least one respective difference limit, the process determines that the power feeds are not separately-sourced redundant power feeds connected to the system, and based on determining that the power feeds are not separately-sourced redundant power feeds, the process initiates a corrective action to ensure that the system is connected to separately-sourced redundant power feeds.

15 Claims, 8 Drawing Sheets

(56) References Cited

U.S. PATENT DOCUMENTS

| | | | | |
|---|---|---|---|---|
| 8,686,594 | B2 * | 4/2014 | Morales | G06F 1/26 |
| | | | | 307/64 |
| 8,825,416 | B2 * | 9/2014 | Arya | G01R 29/18 |
| | | | | 702/72 |
| 9,041,250 | B1 * | 5/2015 | Czamara | G06F 1/26 |
| | | | | 307/64 |
| 9,720,476 | B1 * | 8/2017 | Nguyen | G06F 1/263 |
| 9,973,006 | B1 * | 5/2018 | Nguyen | H02J 3/0073 |
| 10,014,713 | B1 * | 7/2018 | Nguyen | H02J 9/061 |
| 10,020,677 | B2 | 7/2018 | Hansell et al. | |
| 10,330,812 | B1 | 6/2019 | Barnett et al. | |
| 10,340,808 | B2 * | 7/2019 | Ferencz | H02M 3/33573 |
| 10,831,251 | B1 * | 11/2020 | Ross | G06F 1/30 |
| 10,884,469 | B2 * | 1/2021 | Lin | G06F 9/5094 |
| 11,183,879 | B1 | 11/2021 | Barnett et al. | |
| 2004/0039536 | A1 * | 2/2004 | Garnett | G01R 31/40 |
| | | | | 702/58 |
| 2008/0218153 | A1 * | 9/2008 | Patel | G01R 29/04 |
| | | | | 324/76.19 |
| 2010/0060259 | A1 | 3/2010 | Vaswani et al. | |
| 2011/0130992 | A1 | 6/2011 | Kolwalkar et al. | |
| 2012/0074794 | A1 * | 3/2012 | Morales | H02J 9/00 |
| | | | | 307/147 |
| 2015/0200567 | A1 * | 7/2015 | Huang | H02J 9/062 |
| | | | | 307/64 |
| 2015/0214781 | A1 * | 7/2015 | Ye | H02J 9/061 |
| | | | | 307/64 |
| 2020/0249734 | A1 * | 8/2020 | Kennedy | G06F 1/28 |
| 2020/0409347 | A1 * | 12/2020 | Berry | G05B 23/0213 |
| 2022/0083114 | A1 * | 3/2022 | Schwabe | G06N 3/08 |
| 2022/0083242 | A1 * | 3/2022 | Szczepanik | G06F 3/0653 |
| 2022/0164015 | A1 * | 5/2022 | Pearson | G06F 11/2015 |
| 2023/0084259 | A1 * | 3/2023 | Mesgarani | G06F 11/3089 |
| | | | | 702/182 |
| 2024/0319780 | A1 * | 9/2024 | Griffith | G06F 1/28 |

OTHER PUBLICATIONS

Anonymous, "System and Method for Sizing and Demand Management in the Smart Grid", IP.COM, IP.com No. IPCOM000219525D, published Jul. 5, 2012 (20 pages) (Year: 2012).

Anonymous, "Medium Voltage Transformer Pair", IP.COM, IP.com No. IPCOM000245322D, published Feb. 29, 2016 (9 pages) (Year: 2016).

Arar, Dr. Steve, "Fourier Series Circuit Analysis—an Intro to Fourier Series Representation", All About Circuits, published Online on Oct. 16, 2022, at: https://www.allaboutcircuits.com/technical-articles/fourier-series-circuit-analysis-an-introduction-to-fourier-series-representation/ (9 pages) (Year: 2022).

Datacenter.com, "The Importance of Uptime in the Data Center", published Online on Sep. 11, 2019, at: https://datacenter.com/news_and_insight/the-importance-of-uptime-in-the-data-center/ (5 pages) (Year: 2019).

DATAQ Instruments, "FFT (Fast Fourier Transform) Waveform Analysis", accessed and downloaded Online on May 5, 2023, at: https://www.dataq.com/data-acquisition/general-education-tutorials/fft-fast-fourier-transform-waveform-analysis.html (13 pages) (Year: 2023).

IRENA & ETSAP, "Renewable Energy Integration in Power Grids", IEA-ETSAP & IRENA Technology Brief E15, published Apr. 2015 (36 pages) (Year: 2015).

Olikara, Kevin, "Power and Quality Issues, Impacts, and Mitigation for Industrial Customers", Rockwell Automation (7 pages) (Year: 2021).

Osgood, Brad, "Lecture Notes for EE 261: The Fourier Transform and its Applications", Stanford University, published Online at: https://see.stanford.edu/materials/lsoftaee261/book-fall-07.pdf (428 pages) (Year: 2007).

Pillai et al., "Grounding and Ground Fault Protection of Multiple Commercial Power Systems Generator Installations on Medium-Voltage Industrial and Commercial Power Systems", IP.COM, IP.com No. IPCOM000217575D, published May 8, 2012 (37 pages) (Year: 2011).

Sunbird, "Understanding the Cost of Data Center Downtime", published Online on Feb. 3, 2020, at: https://www.sunbirddcim.com/blog/understanding-cost-data-center-downtime (4 pages) (Year: 2020).

Taft et al., "Sensing and Measurement for Advanced Power Grids", Version 1.3, published Oct. 22, 2012 (34 pages) (Year: 2012).

Taft, JD, PhD, "Electric Grid Resilience and Reliability for Grid Architecture", Pacific Northwest National Laboratory (PNNL-26623), published Mar. 2018 (16 pages) (Year: 2018).

Tang et al., "Summary of Electric Distribution System Analyses with a Focus on DERs", published Apr. 2017 (50 pages) (Year: 2017).

* cited by examiner

| MEASUREMENT | LIMIT | WEIGHTING |
|---|---|---|
| VOLTAGE, RMS | 2% | 1 |
| FREQUENCY | 0.5% | 10 |
| THD | 50% | 5 |
| FFT PEAK 1 | UNIQUE FREQUENCY/MAGNITUDE | 1 |
| FFT PEAK 2 | UNIQUE FREQUENCY/MAGNITUDE | 1 |

FIG. 7A

| MEASUREMENT | SOURCE 1 | SOURCE 2 | DIFFERENCE (%) | EXCEEDS LIMIT? | WEIGHT SCORE |
|---|---|---|---|---|---|
| VOLTAGE, RMS | 208.26 VAC | 214.29 VAC | 2.89 | YES | 1 |
| FREQUENCY | 59.998 Hz | 59.997 Hz | -0.0016 | NO | 0 |
| THD | 0.143% | 2.319% | 1520 | YES | 5 |
| FFT PEAK 1 | 2.8 IkHz | 1.2 kHz | UNIQUE | YES | 1 |
| FFT PEAK 2 | 10.5 MHz | 65 kHz | UNIQUE | YES | 1 |

FIG. 7B

FACILITATING SEPARATELY-SOURCED REDUNDANT POWER FEEDS TO A SYSTEM

BACKGROUND

This invention relates generally to facilitating operational availability of a system, and in particular, to ensuring presence of separately-sourced redundant power feeds to a system to enhance system availability.

Electronic equipment, such as information technology equipment, communications equipment, automation and control equipment, industrial equipment, and other equipment that operates in a high-availability manner, requires a robust electrical power source. Equipment that is designed for such operating conditions is often configured for separate, redundant power supplies or connections as part of the equipment. Facilities that utilize such equipment often provide electrical utility power that is sourced from two separate, independent utility grids as a way of improving the overall availability of the equipment's function.

SUMMARY

Certain shortcomings of the prior art are overcome, and additional advantages are provided herein through the provision of a computer-implemented method of facilitating separately sourced power feeds to a system. The computer-implemented method includes obtaining voltage waveform data for power feeds connected to the system, and determining for the power feeds, using the obtained voltage waveform data, at least one respective signal characteristic. In addition, the computer-implemented method includes comparing the respective signal characteristics of the power feeds to ascertain at least one signal characteristic difference between the power feeds, and based on the at least one signal characteristic difference not exceeding at least one respective difference limit, determining that the power feeds are not separately-sourced redundant power feeds connected to the system. Based on determining that the power feeds are not separately sourced power feeds, the computer-implemented method further includes initiating a corrective action to ensure that the system is connected to separately-sourced redundant power feeds.

Computer systems and computer program products relating to one or more aspects are also described and claimed herein. Further, services relating to one or more aspects are also described and may be claimed herein.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

FIGS. 7A-7B depict one use example of a power feed detection and correction workflow, in accordance with one or more aspects of the present invention.

DETAILED DESCRIPTION

The accompanying figures, which are incorporated in and form a part of this specification, further illustrate the present invention and, together with this detailed description of the invention, serve to explain aspects of the present invention. Note in this regard that descriptions of well-known systems, devices, processing techniques, etc., are omitted so as to not unnecessarily obscure the invention in detail. It should be understood, however, that the detailed description and this specific example(s), while indicating aspects of the invention, are given by way of illustration only, and not limitation. Various substitutions, modifications, additions, and/or other arrangements, within the spirit or scope of the underlying inventive concepts will be apparent to those skilled in the art from this disclosure. Note further that numerous inventive aspects or features are disclosed herein, and unless inconsistent, each disclosed aspect or feature is combinable with any other disclosed aspect or feature as desired for a particular application of the concepts disclosed.

Note also that illustrative embodiments are described below using specific code, designs, architectures, protocols, layouts, schematics, or tools only as examples, and not by way of limitation. Furthermore, the illustrative embodiments are described in certain instances using particular software, hardware, tools, or data processing environments only as example for clarity of description. The illustrative embodiments can be used in conjunction with other comparable or similarly purposed structures, systems, applications, or architectures. One or more aspects of an illustrative embodiment can be implemented in software, hardware, or a combination thereof.

Figure 1:
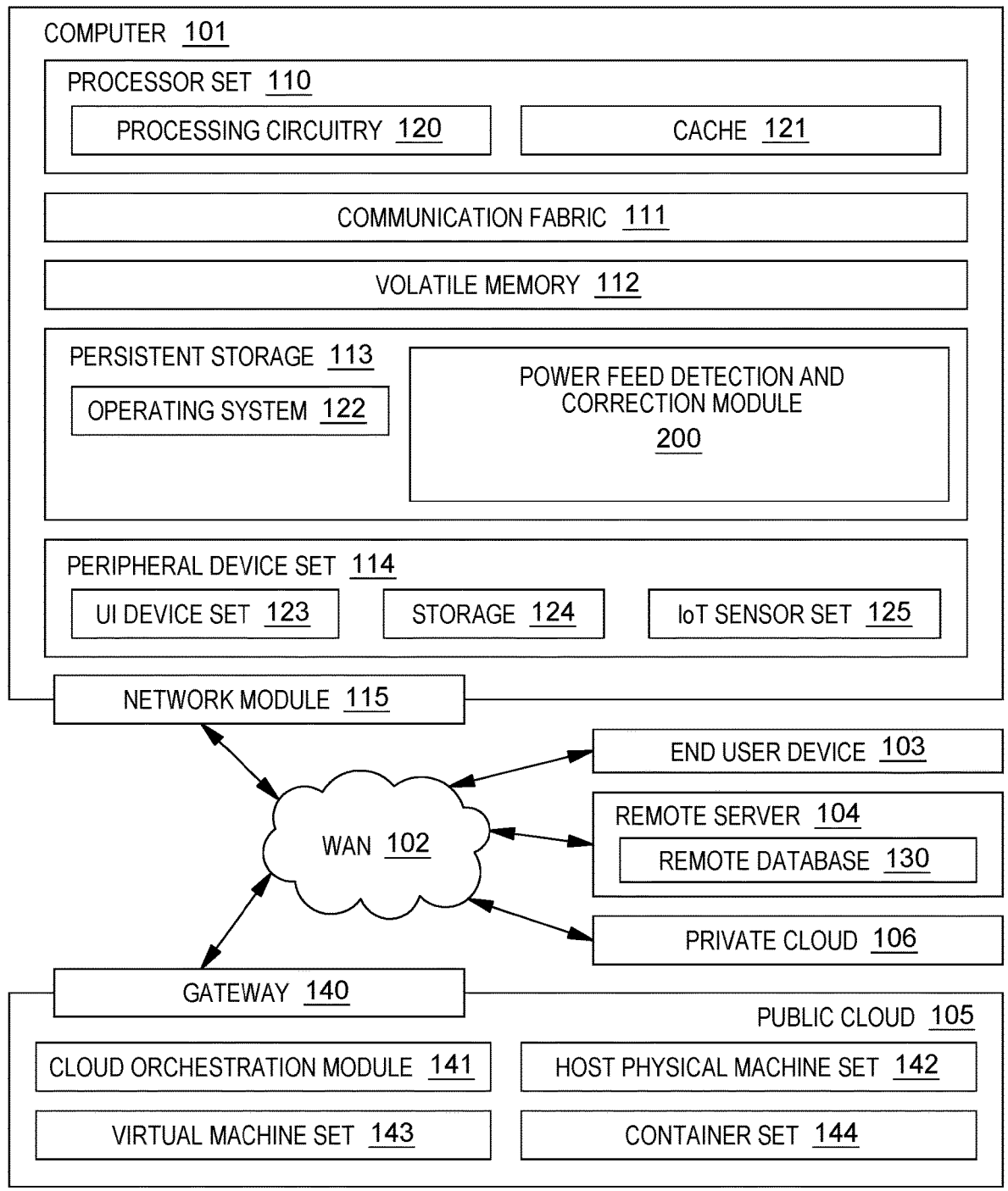
FIG. 1 depicts one example of a computing environment to include and/or use one or more aspects of the present invention.

As understood by one skilled in the art, program code, as referred to in this application, can include software and/or hardware. For example, program code in certain embodiments of the present invention can utilize a software-based implementation of the functions described, while other embodiments can include fixed function hardware. Certain embodiments combine both types of program code. Examples of program code, also referred to as one or more programs, are depicted in FIG. 1, including operating system 122 and power feed detection and correction module 200, which are stored in persistent storage 113.

One or more aspects of the present invention are incorporated in, performed and/or used by a computing environment. As examples, the computing environment can be of various architectures and of various types, including, but not limited to: personal computing, client-server, distributed, virtual, emulated, partitioned, non-partitioned, cloud-based, quantum, grid, time-sharing, clustered, peer-to-peer, mobile, having one node or multiple nodes, having one processor or multiple processors, and/or any other type of environment and/or configuration, etc., that is capable of executing a process (or multiple processes) that, e.g., perform power feed detection and correction processing, such as disclosed herein. Aspects of the present invention are not limited to a particular architecture or environment.

Prior to further describing detailed embodiments of the present invention, an example of a computing environment to include and/or use one or more aspects of the present invention is discussed below with reference to FIG. 1.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as production process control module block 200. In addition to block 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

Computer 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

Processor set 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

Communication fabric 111 is the signal conduction paths that allow the various components of computer 101 to communicate with each other. Typically, this fabric is made of switches and electrically conductive paths, such as the switches and electrically conductive paths that make up busses, bridges, physical input/output ports and the like.

Other types of signal communication paths may be used, such as fiber optic communication paths and/or wireless communication paths.

Volatile memory 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

Persistent storage 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface type operating systems that employ a kernel. The code included in block 126 typically includes at least some of the computer code involved in performing the inventive methods.

Peripheral device set 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

Network module 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End User Device (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

Remote server 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

Public cloud 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economics of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

The computing environment described above is only one example of a computing environment to incorporate, perform and/or use one or more aspects of the present invention. Other examples are possible. Further, in one or more embodiments, one or more of the components/modules of FIG. 1 need not be included in the computing environment and/or are not used for one or more aspects of the present invention. Further, in one or more embodiments, additional and/or other components/modules can be used. Other variations are possible.

Figure 2:
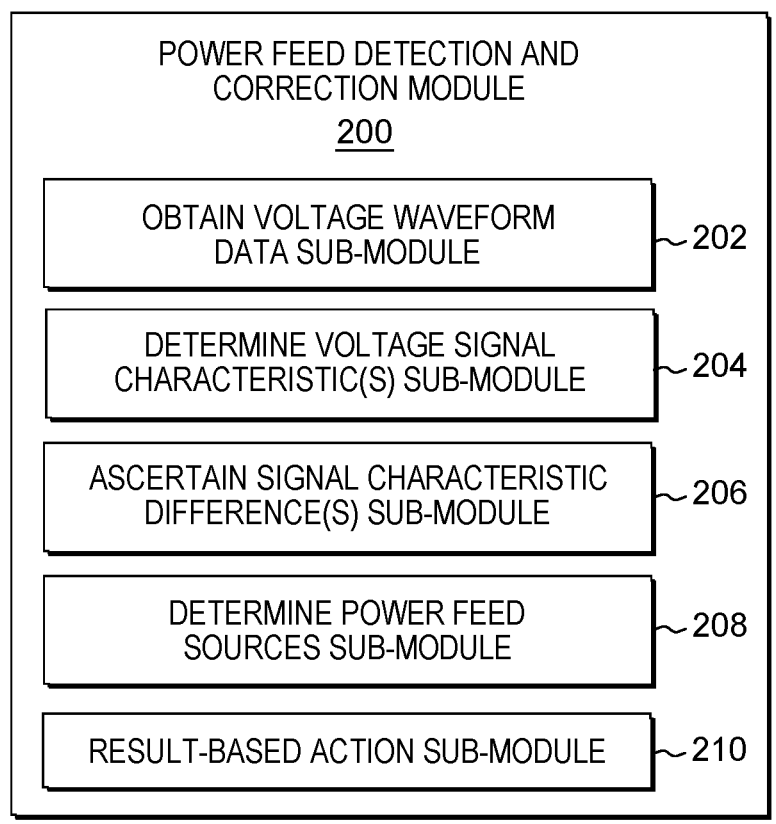
FIG. 2 depicts one embodiment of a computer program product with a power feed detection and correction module, in accordance with one or more aspects of the present invention.
Figure 3:
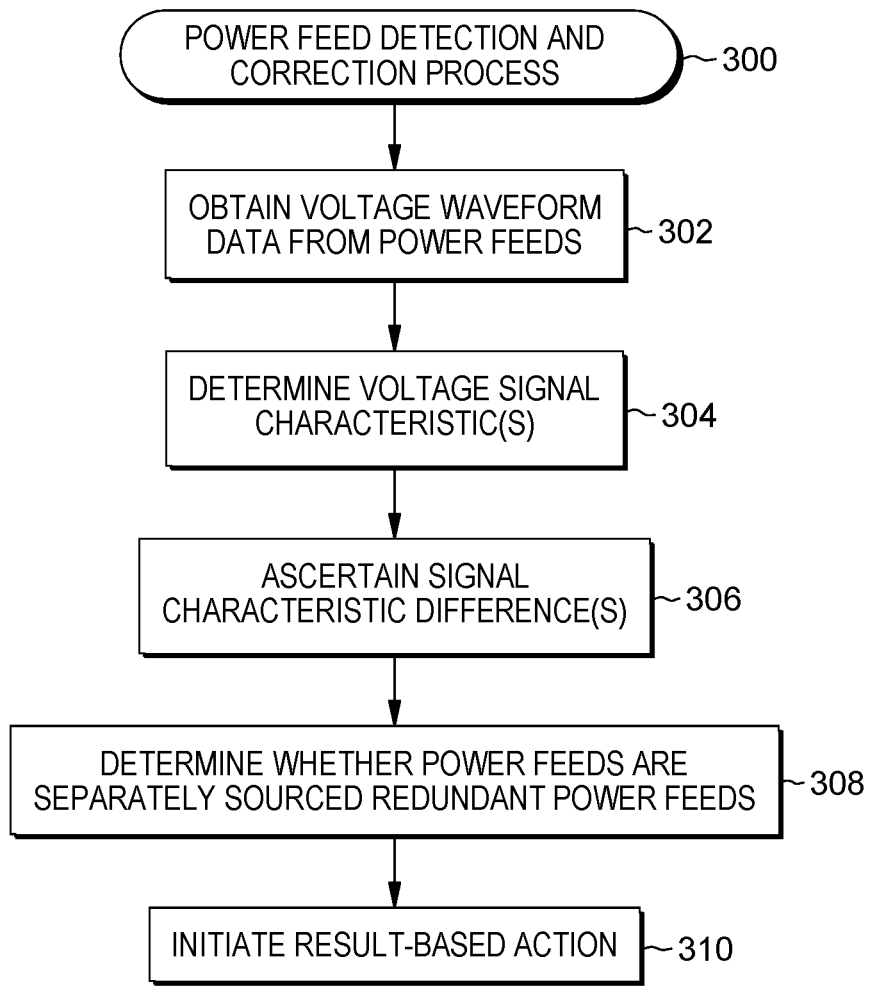
FIG. 3 depicts one embodiment of a power feed detection and correction workflow, in accordance with one or more aspects of the present invention.

By way of example, one or more embodiments of a power feed detection and correction module and workflow are described initially with reference to FIGS. 2-3. FIG. 2 depicts one embodiment of power feed detection and correction module 200 that includes code or instructions to perform a power feed detection and correction workflow, in accordance with one or more aspects of the present invention, and FIG. 3 depicts one embodiment of a power feed detection and correction workflow, in accordance with one or more aspects of the present invention.

Referring to FIGS. 1 & 2, power feed detection and correction module 200 includes, in one example, various sub-modules used to perform processing, in accordance with one or more aspects of the present invention. The sub-modules are, e.g., computer-readable program code (e.g., instructions) and computer-readable media (e.g., persistent storage (e.g., persistent storage 113, such as a disk) and/or a cache (e.g., cache 121), as examples). The computer-readable media can be part of a computer program product and can be executed by and/or using one or more computers, such as computer(s) 101; processors, such as a processor of processor set 110; and/or processing circuitry, such as processing circuitry of processor set 110, etc.

In the FIG. 2 embodiment, example sub-modules of power feed detection and correction module 200 include, for instance, an obtain voltage waveform data sub-module 202 to obtain voltage waveform data for power feeds connected to the system; a determine voltage signal characteristic(s) sub-module 204 to determine for the power feeds, using the obtained voltage waveform data, at least one respective voltage signal characteristic; an ascertain signal characteristic difference(s) sub-module 206 to, at least in part, compare the respective voltage signal characteristics of the power feeds to ascertain at least one signal characteristic difference between the power feeds. In addition, the power feed detection and correction module 200 includes a determine power feed sources sub-module 208 to determine, based on the at least one signal characteristic difference not exceeding at least one respective difference limit, that the power feeds are not separately-sourced redundant power feeds connected to the system; and a result-based action sub-module 210 to initiate, based on determining that the power feeds are not separately-sourced redundant power feeds, a corrective action to ensure that the system is connected to separately-sourced redundant power feeds. Advantageously, using power feed detection and correction such as disclosed herein provides assurance of power source redundancy, and therefore, resiliency, in high-availability system environments. In one or more embodiments, the power feed detection and correction module can be used in association with (such as connected to, or integrated into) a variety of system sub-assemblies, such as power supplies, power distribution units, infrastructure management tools, etc., to provide, for instance, time-zero power feed information to a host controller or host system, and/or runtime diagnostic power feed information to the host. Note that although various sub-modules are described, processing such as disclosed herein can use, or include, additional, fewer, and/or different sub-modules. A particular sub-module can include additional code, including code of other sub-modules, or less code. Further, additional and/or other modules can be used. Many variations are possible.

In one or more embodiments, the sub-modules are used, in accordance with one or more aspects of the present invention, to perform power feed detection and correction processing. FIG. 3 depicts one example of a power feed detection and correction workflow, such as disclosed herein. The method is executed, in one or more examples, by a computer (e.g., computer 101 (FIG. 1)), and/or a processor or processing circuitry (e.g., of processor set 110 of FIG. 1). In one example, code or instructions implementing the method, are part of a module, such as power feed detection and correction module 200. In other examples, the code can be included in one or more other modules and/or in one or more sub-modules of the one or more other modules. Various options are available.

As one example, power feed detection and correction process 300 executing on a computer (e.g., computer 101 of FIG. 1), a processor (e.g., a processor of processor set 110 of FIG. 1), and/or processing circuitry (e.g., processing circuitry of processor set 110), obtains voltage waveform data for power feeds connected to a system 302, and determines for the power feeds, using the obtained voltage waveform data, at least one respective voltage signal characteristic 304. Further, the process includes, in one or more embodiments, ascertaining signal characteristic difference(s) 306 by comparing the respective voltage signal characteristics of the power feeds. The process further includes, based on the ascertained signal characteristic difference(s) not exceeding at least one respective difference limit, determining that the power feeds are not separately-sourced redundant power feeds connected to the system 308. Further, the process includes initiating a result-based action 310, based on determining that the power feeds are not separate-sourced redundant power feeds. For instance, the initiating can include initiating an action to ensure that the system is connected to separately-sourced redundant power feeds.

In one embodiment, the action can be one or more corrective actions to ensure that the system is connected to separately-sourced redundant power feeds. For instance, the corrective action can include: re-plugging one or more misplugged power feed cables; forwarding a signal to a system dashboard to facilitate reconfiguring or re-plugging of one or more cables by a technician; and/or placing a work order automatically to reconfigure or re-plug one or more cables to rectify the issue and ensure that the system is connected to separately-sourced redundant power feeds,. Further, in one or more system embodiments, the result-based action can be an automatic action, such as via one or more automatic transfer switches, to reconfigure the redundant power feed connection(s) to the system. In one example, the action is initiated and performed by a computer (e.g., computer 101 (FIG. 1)), a processor of a processor set (e.g., processor set 110), and/or processing circuitry of a processor set (e.g., processor set 110), with the computer being part of, or different from, the system connected to the redundant power feeds. Alternatively, or additionally, an indication can be sent to an operator or other entity that oversees the system or system environment. Based on initiating a generated action, the action is performed. This action can be performed automatically (e.g., using computer code, electronic devices, robotic devices, etc.) and/or manually, depending on the action. Many possibilities exist.

As noted, electronic equipment, such as information technology equipment, communications equipment, automation and control equipment, industrial equipment, and other equipment, that operates in a high-availability manner, requires a robust electrical power source. Equipment that is designed for such operating conditions is often configured for separate, redundant power supplies or connections as part of the equipment. Facilities that utilize such equipment often provide electrical utility power that is sourced from two separate, independent utility grids as a way of improving the overall availability of the equipment's function. Within these facilities, there exists a risk that the equipment may not be connected properly, for instance, due to human error or other factors, resulting in a condition where the redundant utility input connections may be connected to the same utility power feed, rather than to facility-provided, independent connections. Redundant power feeds to a system not connected to, or supplying, separately-sourced power (such as separate and independent power grids), are a single point of failure, and reduce the overall availability potential of the connected system, as well as potentially prolonging any associated power outage. Moreover, such connection errors can remain unnoticed until a power outage occurs, which can also increase the time it takes to pinpoint the actual issue. Disclosed herein are computer-implemented methods, computer systems, and computer program products that detect and facilitate correcting the issue.

Figure 4:
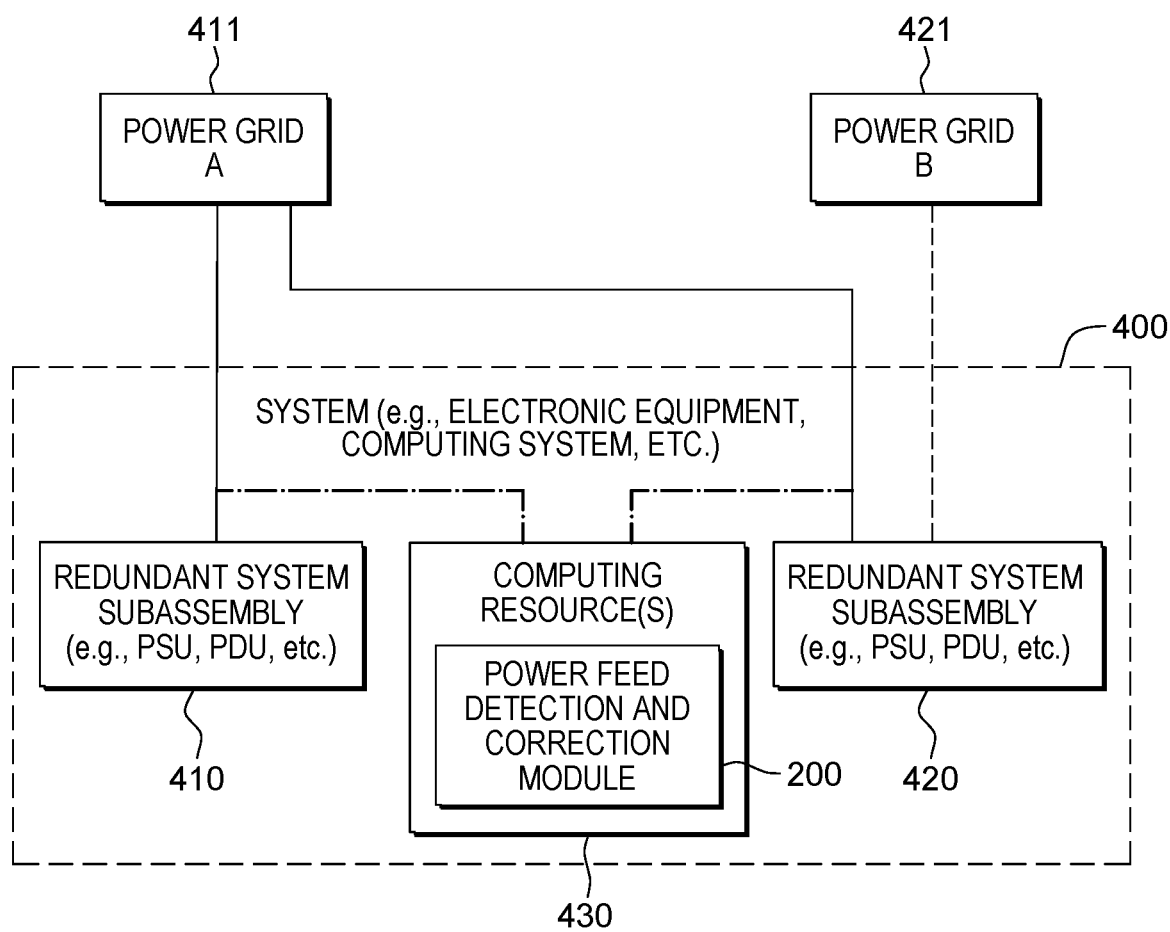
FIG. 4 depicts one example of a system environment within which a power feed detection and correction facility can be included and/or used, in accordance with one or more aspects of the present invention.

The computer-implemented methods, computer systems and computer program products disclosed herein facilitate ensuring separately-sourced redundant power feeds are connected to a system by determining whether two or more incoming electrical utility feeds are originating from the same source, or are separately-sourced power feeds. FIG. 4 depicts one example of a system 400, within which, or in association with which, a power feed detection and correction module or facility 200 (such as disclosed herein) can execute. By way of example only, power feed detection and correction module 200 is depicted as running on one or more computing resource(s) 430, within or associated with system 400. For instance, computing resource(s) 430 can execute program code that implements, for instance, one or more aspects of power feed detection and correction module 200 within or in association with system 400. By way of example only, computing resource(s) 430 can include one or more processors, microcontroller units, digital signal processors, etc. Note that computing resource(s) 430 shown within system 400 is for illustrative purposes only, and is a non-limiting example of an implementation. In one or more other implementations, computing resource(s) 430 can reside in multiple separate computing resources or systems, such as one or more remote computing resources of a computing environment, such as a data center environment, by way of further example.

System 400 can be any of a variety of electronic equipment systems, such as a computing system, information technology (IT) equipment, communications equipment, automation and control equipment, industrial equipment, or other equipment, that operates in a high-availability manner. In the depicted example, system 400 includes redundant system sub-assemblies 410, 420, such as redundant power supply units, redundant power distribution units, etc., each of which is to be powered from a separate and independent power grid 411, 421. In the FIG. 4 embodiment, redundant system sub-assemblies 410, 420 are inadvertently both connected to power grid A 411, rather than, for instance, redundant system sub-assembly 420 being connected to intended power grid B 421. Note that the power grids can be single-phase AC, multi-phase AC, as well as DC systems. In one or more embodiments, the computer-implemented methods, computer systems and computer program products disclosed herein advantageously detect that redundant system sub-assemblies 410, 420 are both connected to the same power source, for instance, power grid A 411, and initiate a corrective action to ensure that the system is connected to two separately-sourced redundant power feeds (e.g., power grid A and power grid B).

In one or more embodiments, power-related instrumentation, as well as computer-aided instrumentation, is used to independently characterize each of the power feeds connected to the system, at which point processing (such as executing at a host controller or host system) compares the results, and determines (e.g., highlights) the differences to determine the relative independence of the two feeds from each other. Advantageously, computer-implemented methods, computer systems and computer program products are disclosed herein for quantitatively characterizing incoming power feeds to distinguish between separate feeds and dependent feeds, for instance, based on a tailored and/or weighted scoring rubric. The power feed detection and correction processing disclosed can, for instance, confirm correct power connections and/or identify incorrectly plugged power connections or feeds to a system, such as a server rack, facility, wall break, facility grid line, etc., and thereby facilitate avoiding unnecessary outages and elongated recovery times where redundant power feeds were incorrectly connected to a common source. In one or more embodiments, the result-based action can, for instance, prevent extended power outages by cycling OFF power connected to the wrong breaker or power feed. Disclosed herein are processes for, for instance, detecting improper power feed wiring and assisting in connecting to separately-sourced redundant power feeds. In one embodiment, the method uses one or more signal characteristics of the power feed, that is, one or more voltage signal characteristics, such as frequency, RMS value, fast Fourier transform (FFT), and total harmonic distortion (THD) characteristics. In one embodiment, signal characteristics, such as AC signal characteristics of the power feeds, are measured via direct contact with the power feeds. No power interruption is needed to identify the signal characteristics.

Figure 5:
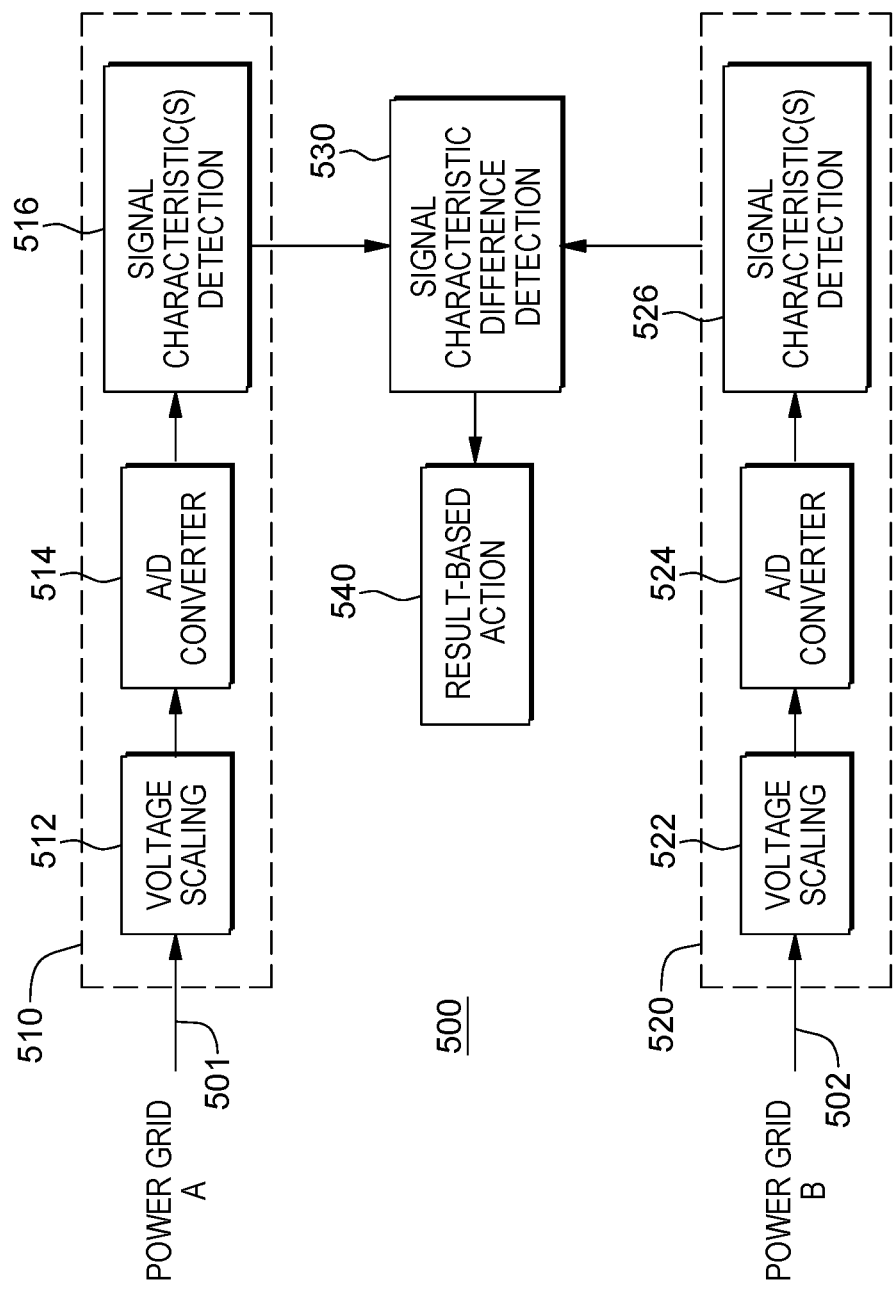
FIG. 5 illustrates another embodiment of a power feed detection and correction workflow, in accordance with one or more aspects of the present invention.

FIG. 5 illustrates a further embodiment of a power feed detection and correction workflow, in accordance with one or more aspects of the present invention. By way of example only, the detection and correction workflow 500 includes, for instance, redundant components and/or processes, which can be integrated or associated with, for instance, redundant power system sub-assemblies, such as redundant system sub-assemblies 410, 420 of FIG. 4, in one example only. As illustrated, the redundant components and/or processes 510, 520 include a voltage scaling component/process 512, 522, which is directly connected to the power feed connections, that is, to the input connections 501, 502 of the system, with the power feeds being labeled power grid A and power grid B in the example of FIG. 5. Each high-voltage source power is scaled down by voltage scaling components 512, 522 to a level that can be fed to respective analog-to-digital (A/D) converters 514, 524, where the scaled signals are converted from analog to digital, and sent to a local processor (in one embodiment), such as a local micro-controller core, digital signal processor, etc., for detecting voltage signal characteristic(s) 516, 526 of the respective power source. The detected signal characteristic(s) are sent, in one embodiment, to a host controller, or host system, to detect or determine signal characteristic difference(s) 530 between the two power sources, with the results of detecting the difference(s) being compared to respective difference limits to facilitate determining a result-based action 540 that is to occur. In the case where the connected power feeds 501, 502 are not actually separately-sourced redundant power feeds, the result-based action can be to initiate a corrective action to ensure that the system is connected to separately-sourced redundant power feeds. Where it is determined that the power feeds are separately-sourced redundant power feeds, then the action can be to, for instance, signal a system dashboard or other system control (such as a data center infrastructure management system), that the power feeds are separately-sourced redundant power feeds.

Detecting the one or more signal characteristics of each respective power source can include, but not be limited to, obtaining (e.g., measuring) voltage values, whether AC or DC, signal frequency values (AC systems only), harmonic distortion values (i.e., total harmonic distortion), and frequency spectrum content values (via, for instance, a fast Fourier transform). Should there be significant differences between the measured characteristics of the power feeds, the detection and correction workflow can flag the differences, and compare them to a predefined set of differential limits to confirm that the power feeds are separately-sourced redundant power feeds, or conversely, to determine that there is a likelihood that the system has been inadvertently misconnected to non-redundant energy sources. In one or more embodiments, a main control (e.g., host controller, or host system) can perform the comparing of the results and send, for instance, the result of the comparison, to a desired location. In one or more embodiments, the power feed detection and correction module or facility disclosed herein can be incorporated as part of an installed system, so that energy feed independence checks can be run, for instance, at the time of installation, on-demand (e.g., manually or automatically), at periodic intervals, after maintenance/repair operations at either the system, facility, or utility-level, etc. Additionally, the power feed detection and correction facility can be implemented as a stand-alone tool, providing useful guidance at the time of product installation. Further, the power feed detection and correction facility can be powered by the energy feeds under test, or from an independent power source, such as a battery or other unrelated power connection.

In one or more implementations, either as an integrated feature, or as a stand-alone tool, the power feed detection and correction facility can include: initializing test and instrumentation hardware; making voltage measurements of all connected power feeds or energy sources, including, but not limited to RMS, average and/or peak-to-peak values, and for AC systems, measure the signal frequency. Further, total harmonic distortion and frequency spectrum content can be measured or determined. In one or more embodiments, the measurements are made within a same timing window. This is to avoid unrelated activity within the facility and/or utility domains from causing unwanted voltage distortions that could impact the analysis, making, for instance, non-unique energy sources appear independent (that is, if sampled during different time windows). For example, this can be achieved by the host controller, or host system, sending a synchronization signal to the local microcontrollers or local processors to obtain the measurements. Utilizing voltage dividers, buffer amplifiers, high-speed analog-to-digital (A/D) converters, and, for instance, a microcontroller or digital signal processor, measurements can be made, with the results stored in either a temporary or permanent storage. Based on accuracy needs, the measurements can be configured as needed. For instance, items such as the number of analog-to-digital samples taken and/or the number of AC line cycles observed, can be changed as desired. Insufficient datapoint collection can result in less accurate analysis of the power feeds. Additionally, utilizing high sample counts and high-A/D resolution can allow for a wider variety of detection types, highlighting different utility distribution grids, different facility internal distribution feeds, or even different local feeds/connections to the same facility branch connection, as desired.

Once the data is collected, the data can be characterized. For instance, the power signal voltage can be compared, and any difference over a certain limit can be used to increase the likelihood that the power feeds originate from multiple locations, that is, are separately-sourced. For frequency, it is generally expected that AC line frequency in a given geographic area will be identical, even with redundant feeds. The frequency measurement, however, can assist with detecting one or more of the following conditions: the use of a conventional utility feed paired with an online uninterruptable power supply (UPS) feed, a system connected to both an AC and a DC feed, a system connected to two independent backup generators, a system connected to multiple multi-phase feeds, with one have an incorrect phase rotation, and/or a system connected to three-phase-derived, single-phase power, where the phase connections are not the same from one side to the other. The measurements made may detect any numerical frequency difference between feeds, as well as any phase-angle differences. Differences between either of these figures can be used to verify energy feed independence to the system, as described herein.

The total harmonic distortion and frequency spectrum content can be determined using a fast Fourier transform (FFT), or other computational means. In particular, the strength of each measured voltage harmonic from each connection can be obtained. It is generally expected that incoming electrical energy source will have experienced voltage waveform distortion from other connected devices that may have high levels of electrical reactivity or otherwise draw current with a poor power factor. In order to measure harmonic distortion, FFT results can be determined by obtaining the signal peaks at multiples of the detected AC line frequency (e.g., Peak 1 and Peak 2). The harmonic distortion measurement would not apply to DC systems. In order to accommodate DC systems, as well as provide greater measurement flexibility, FFT results can be compared with finer frequency resolution. This resolution is configurable within the test. At this point, the results of the FFT test performed on each power feed connection can be compared with each other, and any differences between frequency and relative strength noted.

Figure 6A:
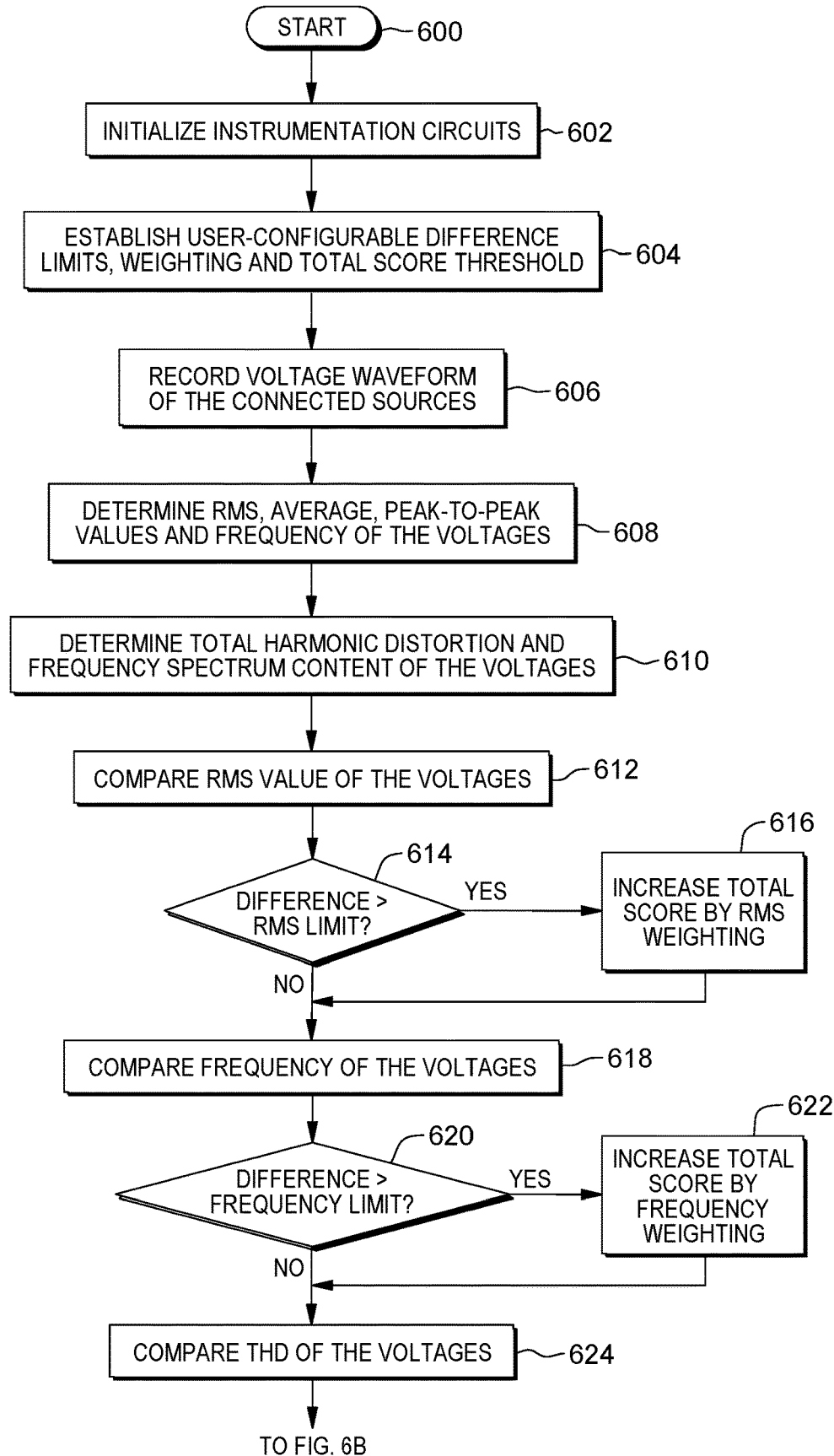
FIGS. 6A-6B are a further embodiment of a power feed detection and correction workflow, in accordance with one or more aspects of the present invention.
Figure 6B:
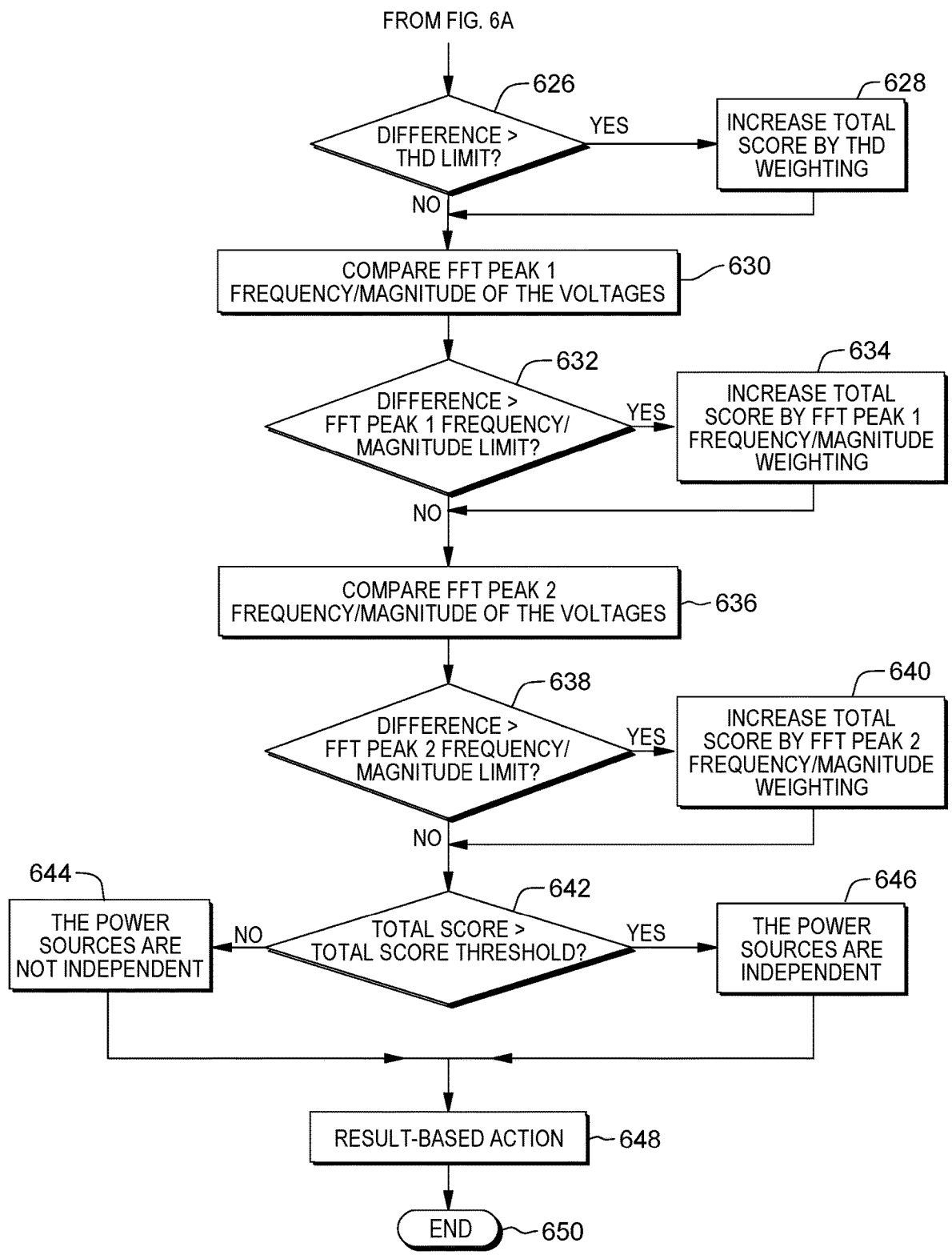

By way of further explanation, FIGS. 6A-6B depict one detailed embodiment of a power feed detection and correction workflow, in accordance with one or more aspects of the present invention. The workflow of FIGS. 6A-6B represents one example only, with fewer or different signal characteristics being possible.

Referring initially to FIG. 6A, the power feed detection and correction process starts 600 with initialing instrumentation circuits 602, and in one embodiment, establishing user-configurable difference limits, weighting scores and a total score threshold 604. Voltage waveforms of the connected power sources are recorded 606, and processing determines, in one or more embodiments, RMS, average, and peak-to-peak values of the voltages, as well as frequency of the voltages 608. In addition, total harmonic distortion and frequency spectrum content of the voltages is determined 610 (in one embodiment).

In one or more implementations, the RMS values of the power feed voltages are compared 612, and processing determines whether the difference of the comparison is greater than a respective difference limit (i.e., an RMS limit) 614. If "yes", then the total score is increased by the corresponding, assigned RMS weighting 616, in one embodiment. Note that this embodiment assumes that, for each characteristic difference exceeding its respective difference limit, there is a corresponding weight score that is included to obtain a weighted characteristic difference score that becomes part of a total characteristic difference score being determined.

In the embodiment of FIGS. 6A-6B, processing also compares frequency of the voltages 618 and determines whether the frequency characteristic difference exceeds the corresponding frequency difference limit 620. If "yes", then the total characteristic difference score is further increased by the frequency weighting score 622.

As illustrated in FIGS. 6A-6B, processing further compares, in one embodiment, the total harmonic distortion (THD) of the power feed voltages 624, and determines whether the difference is greater than the respective total harmonic distortion difference limit 626. If "yes", then the total characteristic difference score is increased by the total harmonic distortion weight score 628. In one or more implementations, processing further compares the fast Fourier transform (FFT) Peak 1 frequency/magnitude of the power feed voltages 630, and determines whether the difference between the Peak 1 frequency/magnitude exceeds the respective FFT Peak 1 difference limit 632. If "yes", then the total characteristic difference is increased by the FFT Peak 1 frequency/magnitude weight score 634. Similarly, the process can further compare the FFT Peak 2 frequency/magnitude of the power feed voltages 636 and determine whether the difference of the comparison exceeds a respective FFT Peak 2 frequency/magnitude difference limit 638. If "yes", then the total characteristic difference score is further increased by the FFT Peak 2 frequency/magnitude weighting 640.

As noted, the particular signal characteristics obtained and compared for the power feeds can vary depending on the application. The RMS, frequency, total harmonic distortion, and Peak 1 & 2 frequency spectrum content comparisons of FIGS. 6A-6B represent one embodiment only of a power feed detection and correction facility, such as disclosed herein.

Once obtained, the total characteristic difference score is compared to a set threshold score, which can also be user-configurable 642. Where the total characteristic difference score exceeds the set threshold score, the power feeds or sources are considered independent 646, and the result-based action 648 can be, for instance, to signal confirmation that the power feeds are in fact separately-sourced redundant power feeds, which completes processing 650. Where the total characteristic difference score is less than the set threshold score 642, then the power feeds are considered not independent 644, and the result-based action 648 can be to, for instance, initiate a corrective action to ensure that the system is connected to separately-sourced redundant power feeds.

FIGS. 7A-7B depict one use-example of the power feed detection and correction workflow of FIGS. 6A-6B, in accordance with one or more aspects of the present invention.

As shown in FIG. 7A, in order to compare two power feeds, or sources, a set of difference limits are established. The limits can be user-configurable and tailor to the specific facility and/or application. Additionally, weighting scores are assigned, showing the relative importance of each measurement to the determination of whether the power feeds are separately-sourced feeds. As with the limits, the weightings can be user-configurable, and can be adjusted based on differences that may typically be seen within a given facility.

As depicted in FIG. 7B, once the measurements are made and compared to the limits, any measurement that exceeds the difference will increment the total score by its weighting. For purposes of example, the difference limits and weightings are defined as illustrated in FIG. 7A. The threshold score is also user-configurable, and in one example, could be defined as 2, meaning that there must be at least 2 over-limit measurement differences to indicate the presence of an independent power source. Once the data is collected, the comparison is made. For instance, the difference in RMS voltage exceeds the 2% limit, and therefore a weight score of 1 is applied to the total characteristic difference score. The frequency does not exceed the respective difference limit, and therefore no weight score is added to the total score. However, the total harmonic distortion differences, as well as the Peak 1 and Peak 2 FFT differences, do exceed their respective limits, and therefore, the corresponding weight scores for each are added to the total characteristic difference score. Thus, in the example of FIG. 7B, the total score is 8. The process has determined therefore that there are two separate, independent power feeds to the system. The process can also compare magnitude of FFT peaks if a conclusive decision cannot be made by comparing only the frequencies.

Those skilled in the art will note that disclosed herein are computer-implemented methods, computer systems and computer program products for facilitating separately-sourced redundant power feeds to a system. The process includes obtain voltage waveform data for power feeds connected to the system, and determining for the power feeds, using the obtained voltage waveform data, at least one respective signal characteristic. The respective signal characteristics of the power feeds are compared to ascertain at least one signal characteristic difference between the power feeds. Based on the at least one signal characteristic difference not exceeding at least one respective difference limit, processing determines that the power feeds are not separately-sourced redundant power feeds connected to the system, and based on determining that the power feeds are not separately sourced power feeds, initiates a corrective action to ensure that the system is connected to separate-sourced redundant power feeds.

In one embodiment, the at least one respective signal characteristic of the power feeds includes at least one respective frequency characteristic. In one or more other implementations, the determining includes determining, using the obtained voltage waveform data, multiple respective signal characteristics for each power feed, with the at least one respective signal characteristic being at least one respective signal characteristic of the multiple respective signal characteristics. For instance, in one embodiment, the multiple respective signal characteristics include a voltage characteristic, a frequency characteristic, a total harmonic distortion characteristic, and a frequency spectrum content characteristic.

In one embodiment, the comparing includes comparing the multiple respective signal characteristics of the power feeds to obtain multiple characteristic differences of the power feeds. Further, the process includes determining, for each characteristic difference of the multiple characteristic differences, whether the characteristic difference exceeds a respective difference limit. For each characteristic difference exceeding its respective difference limit, the process provides a corresponding weight score to obtain a weighted characteristic difference score. A total characteristic difference score is obtained by summing the weighted characteristic difference scores, and determining that the power feeds are not separate-sourced redundant power feeds connected to the system includes determining that the total characteristic difference score does not exceed a set threshold score representative of separately-sourced redundant power feeds.

In one or more embodiments, the respective difference limits, the corresponding weight scores, and the set threshold score, are each user-configurable.

In one implementation, obtaining the voltage waveform data for the power feeds connected to the system includes recording the voltage waveform data for the power feeds to the system within a common timing window.

In one embodiment, obtaining the voltage waveform data for the power feeds includes scaling AC voltage of a power feed connected to the system to obtain a scaled AC voltage, and converting the scaled AC voltage to a DC voltage signal, where the power feed's corresponding voltage waveform data includes the DC voltage signal.

In one or more implementations, based on the at least one signal characteristic difference exceeding the threshold, the process further includes signaling that the power feeds connected to the system are separately-sourced redundant power feeds.

In another embodiment, computer-implemented methods, computer systems and computer program products are provided for determining origination of multiple power feeds to a system by analyzing incoming power feed characteristics. The process includes detecting a plurality of electrical feeds into a system, with each electrical feed having a respective voltage signal, and determining voltage signal characteristics for the plurality of electrical feeds, such as frequency, RMS value, FFT peaks, and THD, to determine feed-line characteristics for the electrical feeds. The voltage signal characteristics are compared to identify any differences over a respective threshold in the feed-line characteristics for the plurality of electrical feeds. When the feed-line characteristics of two of the plurality of electrical feeds exceed their respective difference limits or thresholds, processing can conclude that the two electrical feeds have respective feed-line characteristics that originate from multiple locations, that is, have different voltage sources.

Advantageously, the computer-implemented methods, computer systems, and computer program products disclosed herein facilitate ensuring separately-sourced redundant power feeds are provided to a system. An ability to detect if two separately, independent power feeds are in fact present as input to the system is provided. In addition, n+1, n+k (n+2, n+3, . . . etc.) methods of detecting line voltages/power connections can be used, where k≥1. Also provided is an ability to determine if power feeds are within operational specifications. The process provided allows for user-customization or configuration of adjustable decision-weighting to be applied. Further, in one or more embodiments, digital signal processors and/or high-speed microprocessors, can be used to perform data analysis and comparison via, for instance, a supervisory controller or host microcontroller. Further, time-zero and/or runtime diagnostic information can be provided to a host system on the redundant power feeds. The design can be built into a variety of system subassemblies, such as power supplies, power distributions, infrastructure management tools, etc., and the concepts disclosed herein can be utilized in various test environments. Advantageously, the process disclosed assures power redundancy and/or resiliency in high-availability environments.

The terminology used herein is for the purpose of describing particular embodiments only and is not intended to be limiting of the invention. As used herein, the singular forms "a", "and" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer-implemented method of facilitating separately-sourced redundant power feeds to a system, the computer-implemented method comprising:
    obtaining voltage waveform data for power feeds connected to the system;
    determining for the power feeds, using the obtained voltage waveform data, multiple respective signal characteristics for each power feed;
    comparing the multiple respective signal characteristics of the power feeds to obtain multiple characteristic differences between the power feeds;
    determining, for each characteristic difference of the multiple characteristic differences, whether the characteristic difference exceeds a respective difference limit;
    for each characteristic difference exceeding its respective difference limit, providing a corresponding weight score to obtain a weighted characteristic difference score;
    obtaining a total characteristic difference score by summing the weighted characteristic difference scores;
    determining that the power feeds are not separately-sourced redundant power feeds connected to the system based on determining that the total characteristic difference score does not exceed a set threshold score representative of separately-sourced redundant power feeds; and
    based on determining that the power feeds are not separately sourced power feeds, initiating a corrective action to ensure that the system is connected to separately-sourced redundant power feeds.

2. The computer-implemented method of claim 1, wherein the multiple respective signal characteristics of the power feeds comprise at least one respective frequency characteristic.

3. The computer-implemented method of claim 1, wherein the multiple respective signal characteristics include a total harmonic distortion characteristic, and the comparing includes comparing the total harmonic distortion characteristics of the power feeds.

4. The computer-implemented method of claim 1, wherein the respective difference limits, the corresponding weight scores, and the set threshold score are user-configurable.

5. The computer-implemented method of claim 1, wherein obtaining the voltage waveform data for the power feeds connected to the system includes recording the voltage waveform data for the power feeds to the system within a common timing window.

6. The computer-implemented method of claim 1, wherein obtaining the voltage waveform data for the power feeds comprises:
    scaling AC voltage of a power feed connected to the system to obtain a scaled AC voltage; and
    converting the scaled AC voltage to a DC voltage signal, wherein the power feed's corresponding voltage waveform data comprises the DC voltage signal.

7. The computer-implemented method of claim 1, wherein based on the total characteristic difference score exceeding the set threshold representative of separately-sourced redundant power feeds, the computer-implemented method further comprises signaling that the power feeds connected to the system are separately-sourced redundant power feeds.

8. A computer system for facilitating separately-sourced redundant power feeds to a system, the computer system comprising:
    a memory; and
    at least one processor in communication with the memory, wherein the computer system is configured to perform a method, said method comprising:
        obtaining voltage waveform data for power feeds connected to the system;
        determining for the power feeds, using the obtained voltage waveform data, multiple respective signal characteristics for each power feed;
        comparing the multiple respective signal characteristics of the power feeds to obtain multiple characteristic differences between the power feeds;
        determining, for each characteristic difference of the multiple characteristic differences, whether the characteristic difference exceeds a respective difference limit;
        for each characteristic difference exceeding its respective difference limit, providing a corresponding weight score to obtain a weighted characteristic difference score;
        obtaining a total characteristic difference score by summing the weighted characteristic difference scores;
        determining that the power feeds are not separately-sourced redundant power feeds connected to the system based on determining that the total characteristic difference score does not exceed a set threshold score representative of separately-sourced redundant power feeds; and
        based on determining that the power feeds are not separately sourced power feeds, initiating a corrective action to ensure that the system is connected to separately-sourced redundant power feeds.

9. The computer system of claim 8, wherein the multiple respective signal characteristics include, a total harmonic distortion characteristic, and the comparing includes comparing the total harmonic distortion characteristics of the power feeds.

10. The computer system of claim 8, wherein the respective difference limits, the corresponding weight scores, and the set threshold score are user-configurable.

11. The computer system of claim 8, wherein obtaining the voltage waveform data for the power feeds connected to the system includes recording the voltage waveform data for the power feeds to the system within a common timing window.

12. The computer system of claim 8, wherein based on the total characteristic difference score exceeding the set threshold representative of separately-sourced redundant power feeds, the method further comprises signaling that the power feeds connected to the system are separately-sourced redundant power feeds.

13. A computer program product for facilitating separately-sourced redundant power feeds to a system, the computer program product comprising:
   one or more computer readable storage medium and program instructions embodied therewith, the program instructions being readable by a processing circuit to cause the processing circuit to perform a method comprising:
      obtaining voltage waveform data for power feeds connected to the system;
      determining for the power feeds, using the obtained voltage waveform data, multiple respective signal characteristics for each power feed;
      comparing the multiple respective signal characteristics of the power feeds to obtain multiple characteristic differences between the power feeds;
      determining, for each characteristic difference of the multiple characteristic differences, whether the characteristic difference exceeds a respective difference limit;
      for each characteristic difference exceeding its respective difference limit, providing a corresponding weight score to obtain a weighted characteristic difference score;
      obtaining a total characteristic difference score by summing the weighted characteristic difference scores;
      determining that the power feeds are not separately-sourced redundant power feeds connected to the system based on determining that the total characteristic difference score does not exceed a set threshold score representative of separately-sourced redundant power feeds; and
      based on determining that the power feeds are not separately sourced power feeds, initiating a corrective action to ensure that the system is connected to separately-sourced redundant power feeds.

14. The computer program product of claim 13, wherein obtaining the voltage waveform data for the power feeds connected to the system includes recording the voltage waveform data for the power feeds to the system within a common timing window.

15. The computer program product of claim 13, wherein the multiple respective signal characteristics include a total harmonic distortion characteristic, and the comparing includes comparing the total harmonic distortion characteristics of the power feeds.

* * * * *